(12) United States Patent
Anderson

(10) Patent No.: US 6,640,235 B1
(45) Date of Patent: *Oct. 28, 2003

(54) EXPANDABLE MASS DISK DRIVE STORAGE SYSTEM

(75) Inventor: Michael H. Anderson, Moorpark, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 08/524,475

(22) Filed: Sep. 7, 1995

Related U.S. Application Data

(63) Continuation of application No. 07/932,794, filed on Aug. 20, 1992, now abandoned.

(51) Int. Cl.⁷ .................................................. G06P 1/16
(52) U.S. Cl. ........................................ 708/100; 361/685
(58) Field of Search ............................... 361/685, 727, 361/684; 360/97.03, 98.01, 99.09; 708/100

(56) References Cited

U.S. PATENT DOCUMENTS

| | | | |
|---|---|---|---|
| 3,120,412 | A | 2/1964 | Caldwell |
| 3,623,014 | A | 11/1971 | Doetz et al. ................. 395/200 |
| T932,005 | I4 | 3/1975 | Kurskal ....................... 310/178 |
| 4,338,642 | A * | 7/1982 | Clark et al. ............... 360/99.09 |
| 4,558,914 | A | 12/1985 | Prager et al. |
| 4,598,357 | A | 7/1986 | Swenson et al. ............. 395/425 |
| 4,608,688 | A | 8/1986 | Hansen et al. .............. 371/11.3 |
| 4,648,059 | A | 3/1987 | Gregorcyk |
| 4,722,085 | A | 1/1988 | Flora et al. ................. 371/40.1 |
| 4,733,396 | A | 3/1988 | Baldwin et al. ........... 371/40.2 |
| 4,761,785 | A | 8/1988 | Clark et al. .................... 371/2.2 |
| 4,833,554 | A * | 5/1989 | Dalziel et al. ........... 360/98.04 |
| 4,853,807 | A * | 8/1989 | Trager ..................... 360/97.01 |
| 4,858,070 | A | 8/1989 | Buron et al. |
| 4,870,643 | A | 9/1989 | Bultman et al. ........... 371/11.1 |
| 4,898,550 | A | 2/1990 | Ayer |
| 4,941,841 | A | 7/1990 | Darden et al. |
| 4,996,628 | A * | 2/1991 | Harvey et al. ............... 361/735 |
| 5,037,319 | A | 8/1991 | Hatagishi |
| 5,056,073 | A * | 10/1991 | Fitzgerald et al. ............. 367/36 |
| 5,123,000 | A * | 6/1992 | Fitzgerald et al. ............. 369/36 |
| 5,124,886 | A | 6/1992 | Golobay |
| 5,156,556 | A | 10/1992 | Ma |
| 5,235,493 | A | 8/1993 | Yu |
| 5,253,133 | A * | 10/1993 | Guo ........................ 360/97.01 |
| 5,604,662 | A * | 2/1997 | Anderson et al. ........... 312/204 |
| 5,913,926 | A * | 6/1999 | Anderson et al. ........ 360/98.01 |

* cited by examiner

Primary Examiner—Chuong Dinh Ngo
(74) Attorney, Agent, or Firm—Blakely, Sokoloff, Taylor & Zafman LLP

(57) ABSTRACT

Modular disk storage modules are combined to form an expandable disk drive base data storage system. Additional modules containing disk drives can be added to the system as memory requirements increases. Data and parity information is distributed amongst three or more disk drives in order to enable data recovery if one of the disk drives ceases to function properly.

19 Claims, 5 Drawing Sheets

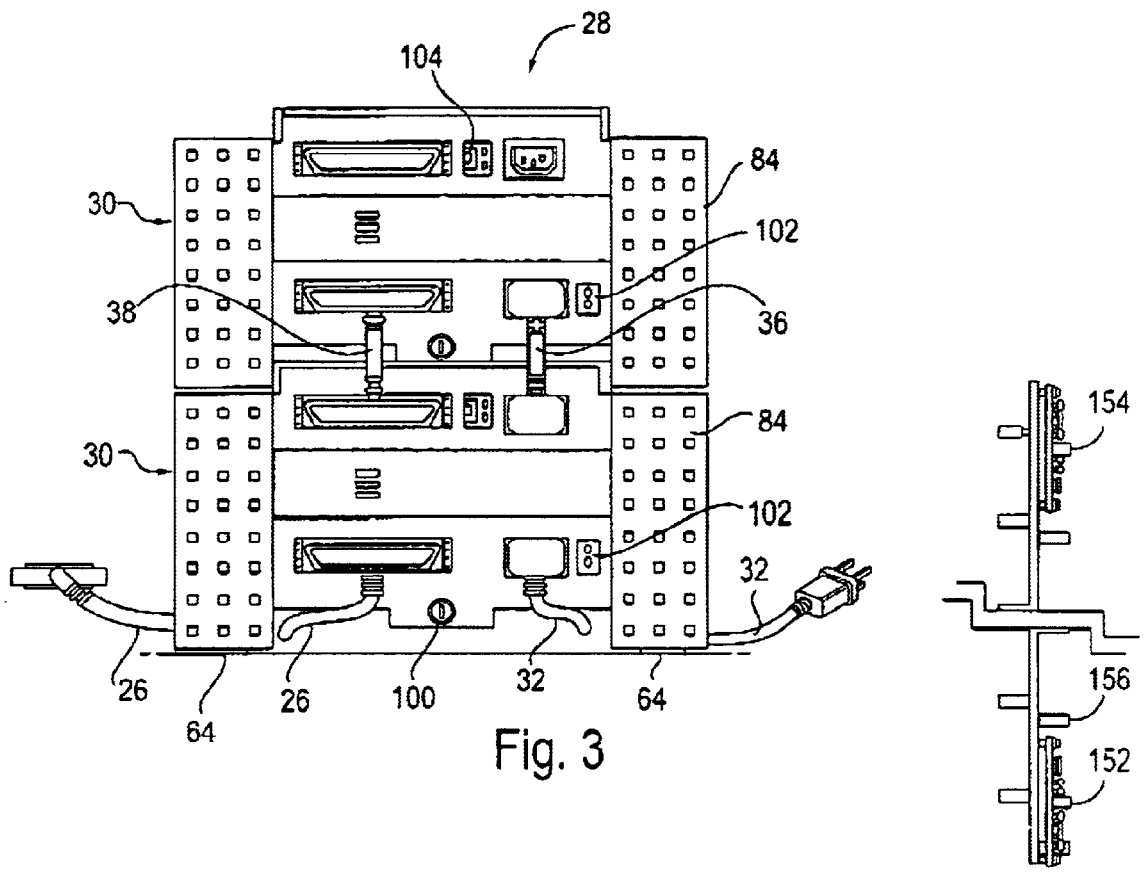
Fig. 3
Fig. 6B
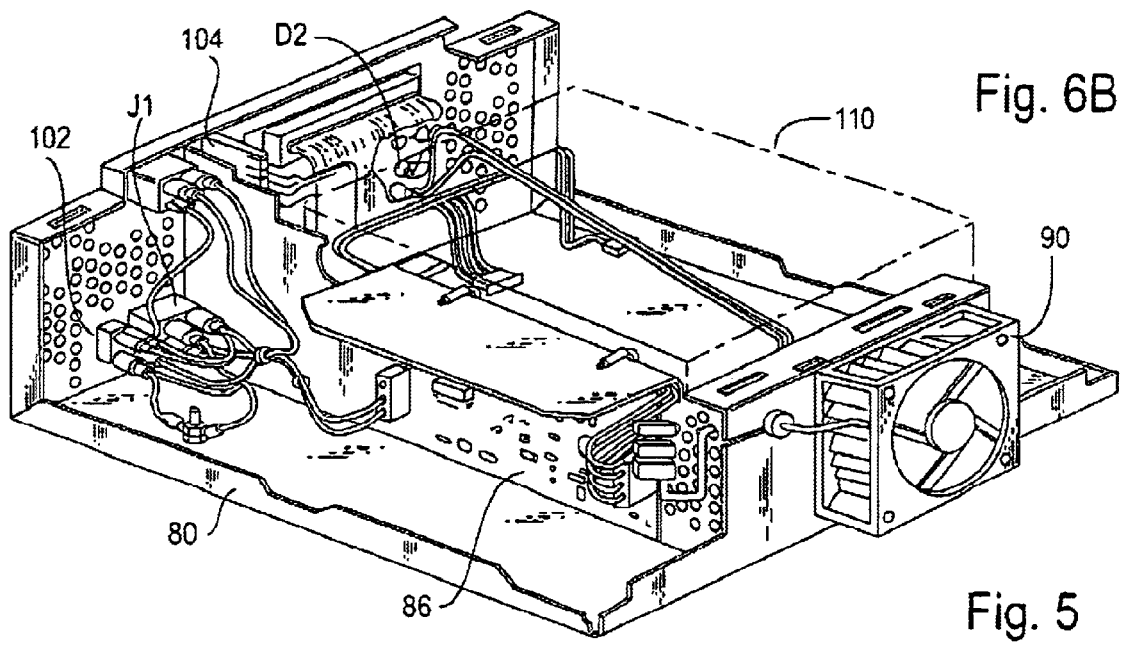
Fig. 5

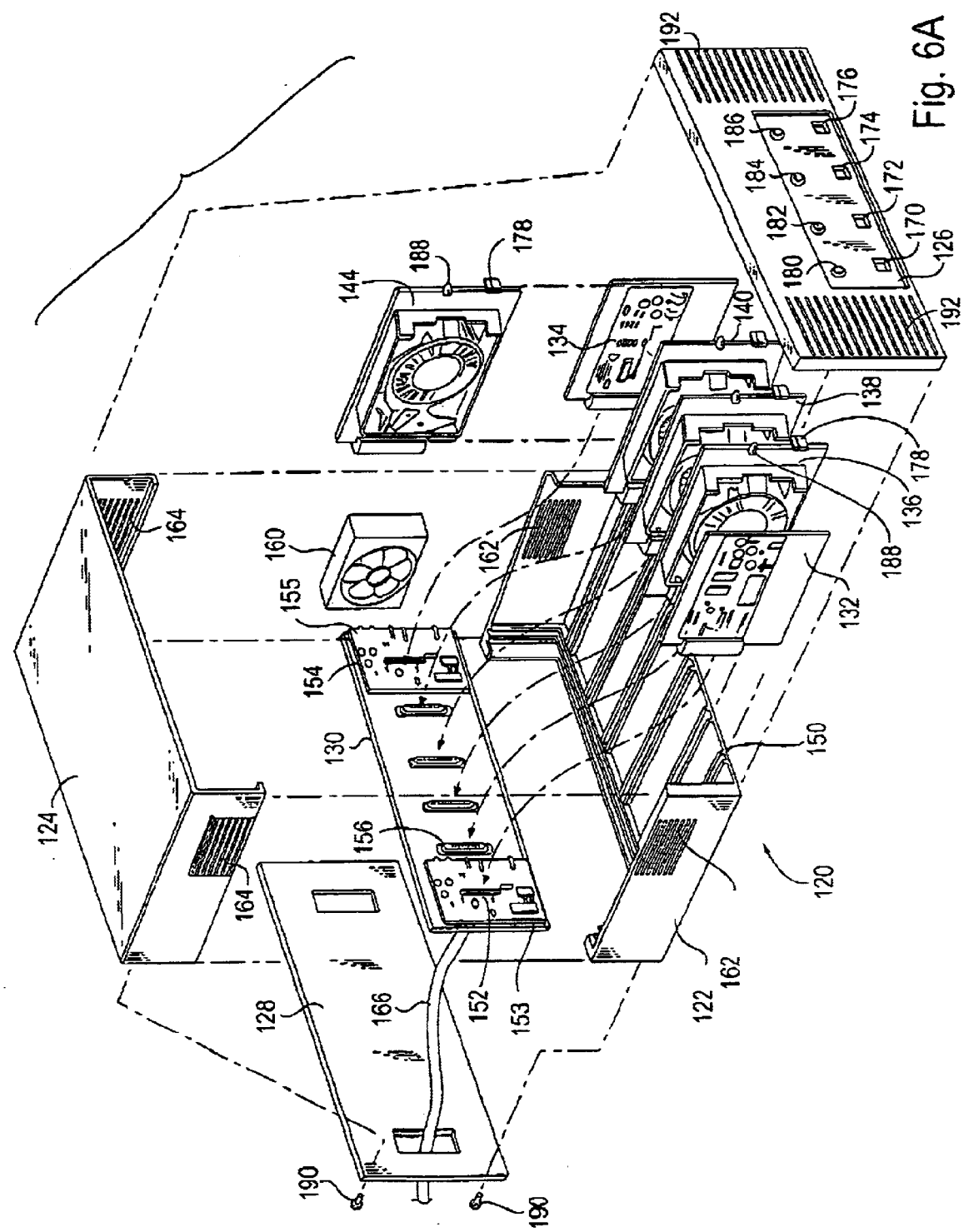

EXPANDABLE MASS DISK DRIVE STORAGE SYSTEM

This application is a continuation of application Ser. No. 07/932,794, filed Aug. 20, 1992, now abandoned.

FIELD OF THE INVENTION

The present invention relates generally to disk drive based data storage systems. More particularly, the present invention relates to modular disk drive expansion capabilities for computers.

BACKGROUND OF THE INVENTION

Most computers employ Winchester (hard) type disk drives to store programs and data. The data capacity of the particular disk drive depends on the user's anticipated storage requirements. It is often difficult to add data storage capability to a computer system once it has been configured. This difficulty is usually more dominant with personal computer type systems, but can present itself with work stations, as well as larger systems.

External disk drive storage systems, which were often referred to as "Bernouli Boxes", have provided the capability for adding an external disk drive to replace or augment the internal disk drive of a personal computer or work station. Several different data protocols have been adapted for use in conjunction with external data storage systems. These protocols are used in some systems to transfer data between internal components as well. The most popular of these protocols are the Small Computer Systems Interface (SCSI) and Enhanced Small Device Interface (ESDI). The SCSI and ESDI protocols and associated hardware allow data flow at rates of several megahertz, whereas Disk Operating System (DOS) data transfer rates have difficulty achieving these data transfer rates. Transfer rates of 5 megahertz or more are fairly common using the SCSI interface.

In most systems, a single power supply is coupled to a number of individual peripheral components including disk drives. The capacity of the system power supply is predetermined, and is based on the expected load that the system is anticipated to draw. Increasing the number of peripheral devices, or the capacity of peripheral devices such as disk drives results in a requirement for additional power which may have been unanticipated. As a result, it may be necessary to replace the power supply once it has been determined that it is necessary to expand the system capabilities.

When the power supply capabilities are expanded, an attempt is made to determine whether the new power supply will accommodate the future power supply requirements of the system. Future expansion beyond the anticipated load necessitates replacing the power supply again.

When hard disk drives were originally introduced, failure of the hard disk drive to maintain data, or to be able to recover the data was not uncommon. As a result, most users instituted rigid back-up programs using removable media such as floppy disk drive and tape back ups. As hard disk drives have become more reliable, many users have reduced their reliance on backing up the data stored within the system.

Hard disk drives have also increased in capacity from relatively modest levels of 10 megabytes to higher density, higher capacity levels approaching 2000 megabytes, and beyond. Backing up a hard disk which held 10 megabytes may have been reasonably time consuming, but backing up a hard disk which may have 100 or 200 times as much data becomes significantly more time consuming. As a result, users have become less diligent in their efforts to back up data from a hard disk drive.

This has resulted in an increased exposure to the user of a computer system should a single hard disk drive crash, or otherwise cease to function properly. The amount of data which may be irretrievably lost can be enormous. The consequences to the system user can be catastrophic. Data recovering centers exist, but may or may not be able to successfully recover the data from a particular hard disk drive, or may take several months to do so. Given the timelines of information in most applications, this becomes unacceptable.

SUMMARY OF THE INVENTION

It is therefore an object of the present invention to provide an easily expandable hard disk drive storage system which can be easily added to without requiring replacement of a power supply, or other integral components.

It is a further object of the present invention to provide a modular expansion system so that the entire system's capability in the future is not restricted by choices made when the system is initially purchased.

It is a further object of the present invention to provide the capability for versatile selection of data transfer systems and organization.

It is a further object of the present invention to provide a high speed data transfer capability between the computer and external peripherals such as disk drives.

It is a further object of the present invention to provide a data storage system from which the data can be easily recovered, or reconstructed should a single hard disk drive fail.

It is a further object of the present invention to provide a versatile disk drive storage system which can be easily expanded after it is in use without sacrificing the data recovery capability of the system.

One feature of the present invention involves the use of a modular design in which peripheral devices such as hard disk drives are added in uniform stackable modules which include self contained power supplies. The individual modules interconnect mechanically to form a single structure which can be easily added to, or subtracted from.

Another feature of the invention involves the use of a number of individual, short interconnection cables to connect each of the modules together in order to route electrical power between the modules, as well as routing data transfer signals.

Another Embodiment of the present invention distributes data to be stored amongst three or more individual hard disk drives in order to allow data recovery from the remaining hard disk drives if a single hard disk drive ceases to function.

DESCRIPTION OF THE DRAWINGS

FIG. 3 is a front view of two modules of the illustrated embodiment of FIG. 1 fully assembled.

FIG. 5 is an illustration of the physical layout of the modules of the illustrated embodiment of FIG. 1.

FIG. 6 is an illustration of an alternative embodiment of the present invention.

DETAILED DESCRIPTION OF THE PREFERRED EMBODIMENT

Figure 1:
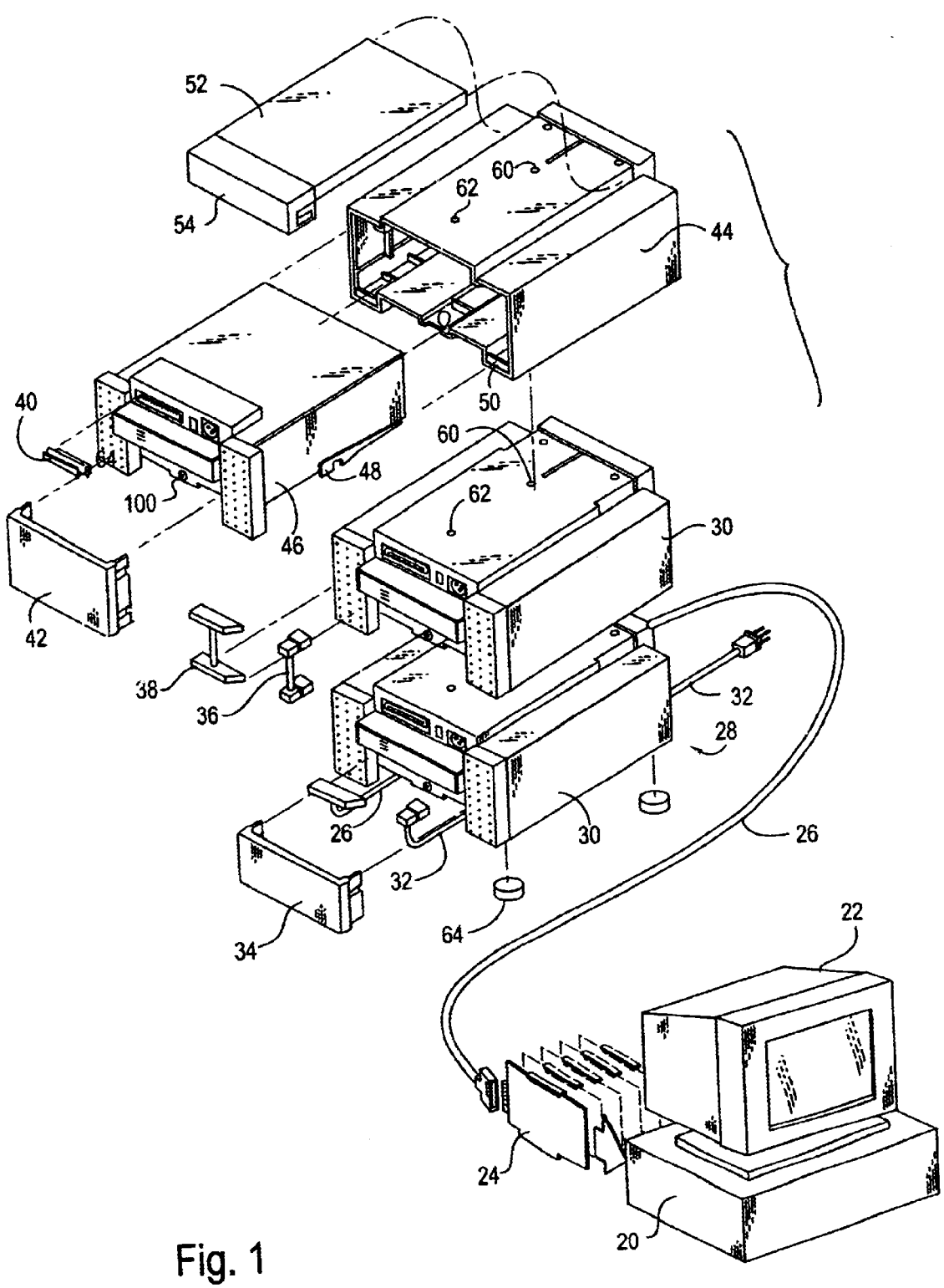
FIG. 1 shows the interconnection of the storage modules illustrating an embodiment of the present invention with a host computer.

Referring to FIG. 1, a personal computer 20 having a monitor 22 and a keyboard (not shown) is connected to the expandable disk drive assembly 28 of the present invention by inserting a communication card 24 such as a SCSI adaptor card into computer 20 and connecting it through cable 26 to system 28.

The expandable disk drive storage system 28 consists of one or more disk drive modules 30. Disk drive modules 30 may be stacked upon one another as shown in FIG. 1. They are fastened together to prevent the upper units from slipping with respect to the lower units by screws or other suitable fasteners. The bottom module 30 in the stack has a power cord 32 which connects the power supply in the bottom module 30 to a power source, such as 110 volts alternating current available from most appliance outlets. Bottom module 30 is also connected to personal computer 20 through cable 26. These connections are made in the front of module 30. Panel cover 34 snaps into the front, lower portion of bottom module 30 to cover the power connector and cable 32 as well as the computer connector and cable 26. Non-skid feet 64 attached under bottom module 30 to prevent bottom module 30 from sliding on a table or other work surface.

Successive modules 30 are placed on top of the bottom module 30 and fastened by suitable fasteners to prevent the modules from moving with respect to each other. Interconnection between adjacent modules 30 is accomplished by power connector assembly 36 and computer connector assembly 38. These connectors are extremely short in length, and the interconnections are accomplished from the front of the modules 30. This avoids the need to route individual power cables 32, or computer interconnection cables 26 for each of the modules added to the system. Additionally, by providing all of the interconnection wiring on the front of module 30, it is not necessary to swivel the modules around to access the rear panel, or rear portion of modules 30 in order to interconnect them with the computer 22, or each other. This also eliminates the need to route interconnection cables from the front of one module 30 to the rear of a subsequent module 30.

Modules 30 consist of an outer housing 44 and an internal, removable assembly 46. Assembly 46 is slid into case 44 along tracks 50. Latches 48 located on both sides of removable assembly 46 prevent removable assembly 46 from sliding out of housing 44. A top panel 52 may be placed on top of the top module 30 of the stack. This provides for closure of the system, sealing assembly holes which are located on the top of the module 30. These assembly holes include holes 60 and 62 which are located in the top of each of the modules 30. Assembly holes 60 and 62 are threaded, and allow a case 44 to be fastened to a lower module 30 by placing screws through matching holes in the bottom of case 44 through threaded openings 60 and 62 of module 30 located beneath case 44. The removable assembly 46 is then slid into case 44.

Depending on the particular data transfer protocol selected, it may be necessary to provide a resistive terminator such as terminator 40 on the connector of the last module in the chain of the system. This reduces, or eliminates signal reflection at high frequencies due to an unterminated transmission line. A connector panel 42 is snapped into the front section of adjacent modules 30 to cover connectors 36 and 38, and provide a more aesthetically pleasing appearance of the system. Top panel 52 has a front portion 54 which covers the terminator 40 and connector area of the top module 30.

Figure 2:
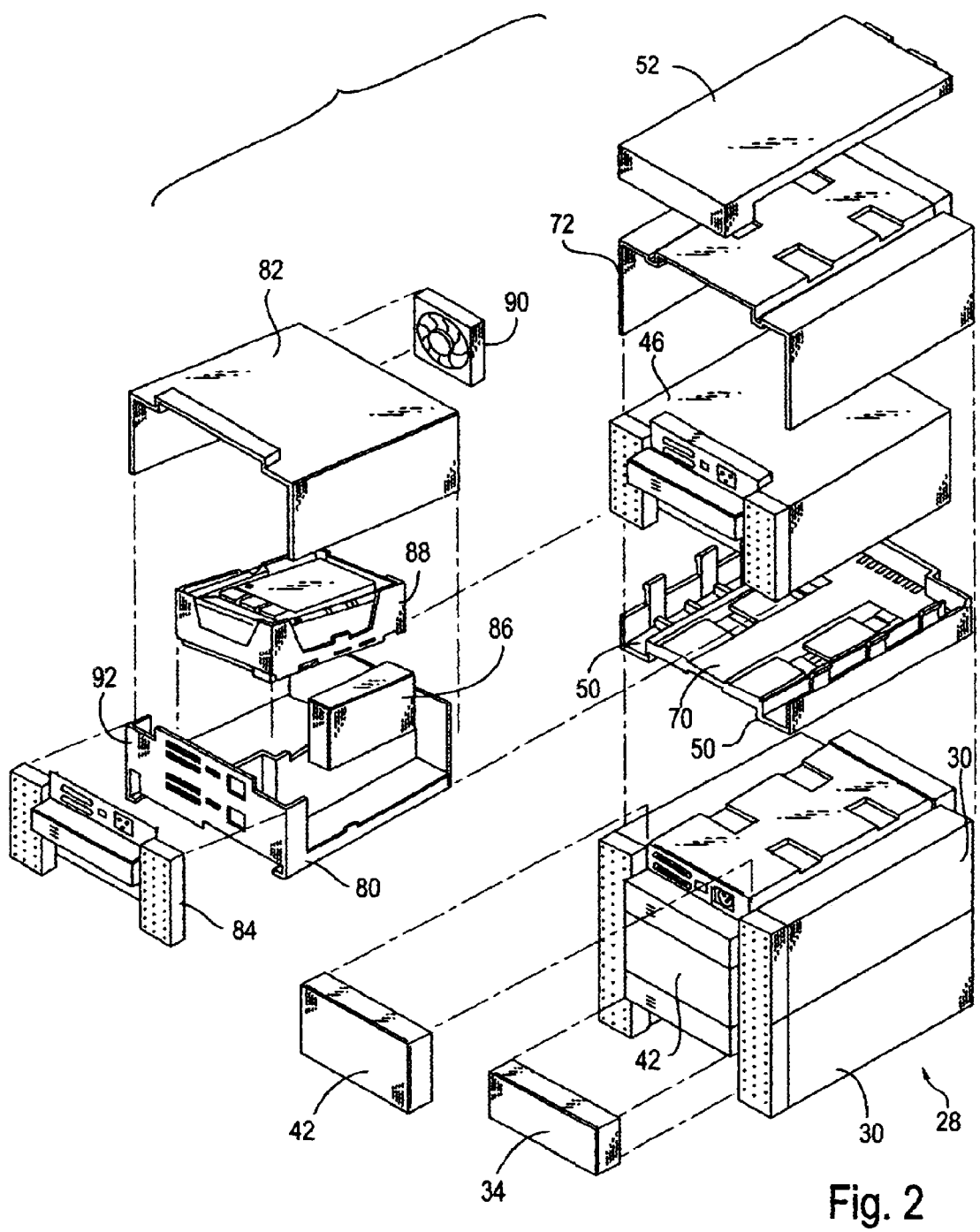
FIG. 2 is a detailed assembly drawing of the illustrated embodiment of FIG. 1.

Referring to FIG. 2, the lower portion of the disk drive expansion stack 28 is shown in a partially assembled condition. A bottom module 30 with a front panel 34 is shown located beneath a middle module 30. Connector panel 42 is shown located beneath lower module 30 and middle module 30. Upper module 30 is shown broken apart so that it can be seen in more detail. Outer case 44 as shown in FIG. 1 is a two part assembly consisting of a base 70 and a top cover 72. Removable assembly 46 is shown located between base 70 and outer cover 72. Tracks 50 are located on the left and right sides of base member 70. For the purposes of explanation, removable assembly 46 is also shown in an expanded view.

Removable assembly 46 consists of a base tray 80 and a tray cover 82 which fit together to enclose power supply 86 and disk drive 88 within removable assembly 46. Fan 90 is affixed to the rear portion of base tray 80 (and is more clearly visible in FIG. 5). A front bezel 84 is affixed to the front portion of base tray 80. Bezel 84 and the front of base tray 80 have selected openings for the placement of connectors for interconnection of both power and computer data transfer signals. Bezel 84 also provides assembly points which meet with connector panel 42.

FIG. 3 shows a front view of the disk drive expansion system 28 for two modules 30. As shown, bottom module 30 rests on feet 64. Power cable 32 is routed underneath the center portion of bottom module 30 and connects to bottom module 30 near the front, lower portion of bottom module 30. Disk drive interface cable 26 is similarly routed beneath the center portion of bottom module 30 and connects computer 20 as shown in FIG. 1 to the lower portion of bottom module 30 as shown in FIG. 3. Cables 36 and 38 provide power and computer signal interconnection, respectively, to interconnect bottom module 30 with the upper module 30 of FIG. 3. A set screw 100 secures the removable drive assembly 46 as shown in FIG. 1 to the case 44. This provides additional security to prevent the removable assembly 46 from sliding out of case 44.

A power switch 102 is located near the lower power feed of module 30. In FIG. 3, a power switch 102 can be seen to the right of the interconnection of power cable 32 with lower module 30. Power switch 102 of the upper module 30 is located to the right side of interconnection cable 36.

Similarly, an address select switch 104 is located near the upper portion of module 30 in between interconnection cables 36 and 38. Selection switch 104 is used to select the address of the particular disk drive or peripheral. Address selection is required with SCSI protocols, as well as a variety of other computer interconnection formats. The address selection switches shown in FIG. 3 both indicate address zero being selected. In actual use, it is necessary to use different addresses for each module 30 which is attached to expansion stack 28.

Figure 4:
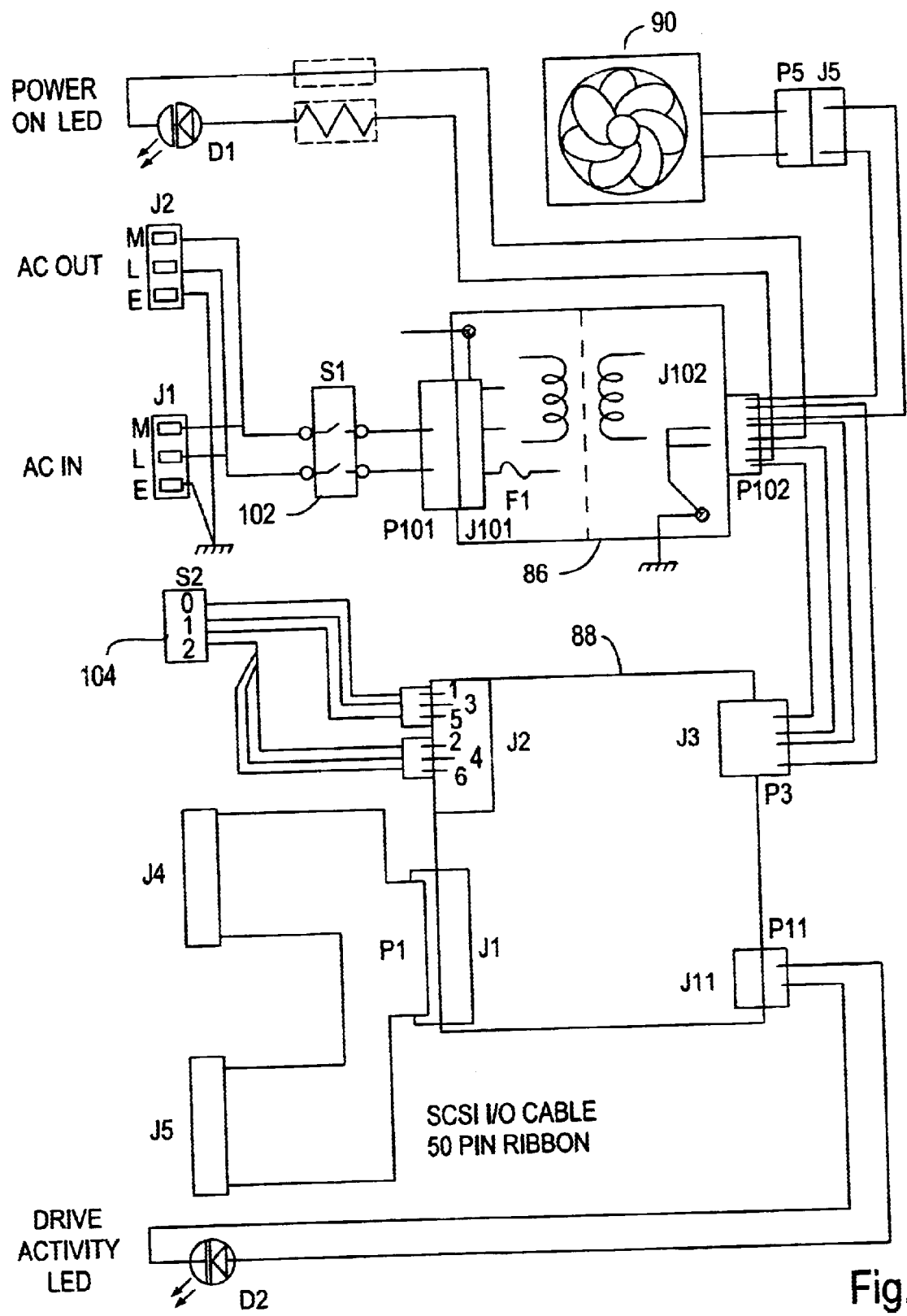
FIG. 4 is a schematic diagram of the circuitry of the modules of the illustrated embodiment of FIG. 1.

Referring to FIG. 4, a schematic of the wiring interconnection of module 30 is shown. The physical lay out of this wiring harness assembly is shown in FIG. 5. Incoming power is supplied to the lower connector J1 which is wired in parallel with output power connector J2 so that power can be routed to the next module 30. Switch 102 connects the incoming power supply to power supply 86. Power supply 86 converts the incoming power supply waveform, typically 110 volts AC to suitable direct current (DC) waveforms to power drive 88 and fan 90. Selection switch 104 is connected to the address section of drive 88 and enables a user to select the address of each drive of expansion stack 28 without having to locate and select jumpers on the disk drive board. It also enables the user of a disk drive to easily set the address required without forcing the user to examine the internal workings of a module, or computer peripheral system, something which is still feared by many in this day of "computerization".

A computer interconnection cable such as a SCSI interface cable is attached to connectors J4 and J5 as shown in FIG. 4. Connectors J4 and J5 route the computer signal to disk drive 88, and allow interconnection of one module 30 to additional modules 30 through the use of the second connector.

A drive activity light omitting diode (LED), D2 is connected to drive 88. The drive activity LED, D2 is activated by drive 88 to indicate to a user when the drive is enabled, and data is being accessed or written.

Referring to FIG. 5, the relative locations of power supply 86, fan 90, and the connector and switch assemblies as they are mounted in base 80 is shown. Disk drive 88 is located in area 100, and is not shown for clarity so that the wire harnesses can be more easily seen.

Referring now to FIG. 6, a more compact peripheral expansion unit is shown. Unlike the system shown in FIG. 1, the configuration of FIG. 6 is not expanded by stacking additional modules on top of each other as module 30 are stacked in FIG. 1. The implementation shown in FIG. 6 includes a bottom enclosure 122 and a top enclosure 124. A front bezel 126 is incorporated as of the front structural member as well. This differs from the configuration of removable assembly 46 in which base tray 80 include a front portion, and bezel 84 fits over the front portion of base tray 80 as shown in FIG. 2.

A rear panel 128 is attached to both the lower portion 122 and upper portion 124 of the enclosure by screws 190. A backplane 130 is located just in front of back panel 128. Backplane 130 provides interconnection for power supply modules 132 and/or power supply module 134. Backplane 130 also provides interconnection for several disk drives which are placed on carrier cards. These disk drives are individually identified as drives 136, 138, 140, and 144, but in practice are identical disk drive assemblies which may be "hard cards" or other hard disk drives which are attached to a mounting board. Power supplies 132 and 134, as well as disk drives 136, 138, 140 and 144 slide into the lower portion of the housing 122 through channels 150 which are preferably attached to (but may be formed within) the bottom half of enclosure 122.

Power supply 132 meets with connector 152 on a power interconnection board 153. Power supply cable 166 allows this power supply assembly to be connected to a power source (such as 110 volts AC). Similarly, power supply 134 is plugged into connector 154 is located on power supply board 155. An additional power cable (not shown) allows board 154 to be connected with a power source. In certain configurations, it may be desirable, or preferable to interconnect boards 155 and 190 so that a single power supply line 166 may be used to provide a power source for the entire system.

A pair of thin, high volume fans 160 are placed on either side of the enclosure, adjacent to power supplies 132 and 134. Vent holes 162 are located in the bottom portion of enclosure 122, and similar vent holes 164 are located in the top portion of enclosure 134. Vent holes 162 and 164 allow air flow through enclosure 132 and 124 to allow cooling of the power supplies and disk drives.

Bezel 126 has two openings for each internal disk drive assembly. Each disk drive assembly includes a disk activation LED188 and a selection switch block 178. Activity LED188 is visible through openings 180, 182, 184, and 186 for disk drives 136, 138, 140, and 144, respectively. Similarly, switch blocks 170 are accessible through openings 170, 172, 174, and 176 for disk drives 136, 138, 140, and 144, respectively. Openings 192 near the outer portion of bezel 125 provide for additional air flow through the system. Preferably, the fans 160 are oriented to expel air out of vent holes 162 and 164. The in flow of air through openings 192, and rear panel 128 provide air flow to cool power supplies 132 and 134, and disk drives 136, 138, 140, and 144.

A computer interconnection cable, not shown, interconnects connectors 156 on mother board 130 with computer 20 (as shown in FIG. 1). This may be the aforementioned SCSI interface protocol as is employed with the modular implementation described in FIGS. 1–5.

In order to allow the disk drives 136, 138, 140, and 144 to be easily mounted in the slots 150 of the bottom portion of enclosure 122, and interconnected to mother board 130, the disk drives are mounted on rigid carriers which may also act as disk controller boards, containing logic circuits, as well as providing mounting for LED188 and switch 178.

The physical side of the disk drives shown in FIG. 6 is smaller than the size of the disk drives 88 as shown in FIG. 2. As a result, the disk drives shown in FIG. 6 are expected to have a lower storage capacity than disk drives 88. By providing a modular expansion system, a user can purchase only the amount of data storage that he believes he requires, and may easily add to it in the future as his needs expand. This allows the user to build on a single investment of an expansion system, without being forced to discard the previous expansion system each time the user wishes to increase his data storage capability. There is no restriction using the present system that each drive added to the system have the same storage capacity, or storage medium. It is possible with the present system to include so called standard winchester disk drives, drives which incorporate vertical recording of magnetic patterns, as well as optical storage drives within the physical configuration of the embodiments.

An additional benefit of the storage technique of the present invention is the ability to distribute data storage and parity information amongst several disk drives. If three drives are employed, data can be stored on two of the drives, and parity checking information for that data stored on a third drive. As a result, if any one of the disk drives fails to operate, all of the data can be restored by accessing the remaining two drives.

If one of the disk drives which contains data fails, that data can be reconstructed by comparing the parity information contained on the third drive with the data contained on the other data drive in order to determine what data has been lost, and reconstructed. Similarly, if the drive containing the parity information fails to operate, the two data drives already contain all of the valid data which can be used to reconstruct the parity information.

This eliminates the need to continuously back up data stored on disk drives in order to ensure that the data is not lost. Additionally, this data protection system may operate with a reduced redundancy as the number of disk drives increases. Using standard back up techniques, a 100% redundancy, or full back up copy, is required. Employing three drives, with two containing data, and one containing one parity bit for every two bits of data results in a 50% decrease in data storage in order to ensure that no data is lost. If four drives are employed, three of the drives can contain data, and the fourth drive contains parity check information for the first three drives. In this configuration, the redundancy factor has been reduced to 33%. Similarly, if five disk drives were employed, data is stored on the first four, and parity information on the fifth. This results in only a 25% redundancy storage factor. As is the case for a three drive system, if one of the five disk drives was to cease functioning, data and parity information on the remaining four can be easily used to reconstruct the missing data, or parity information which was lost.

This technique can be employed as additional disk drives are added to the system. If a system is initially operating with three disk drive, and a fourth is added, the storage protocol of the host computer in one embodiment will change and adapt to a four disk drive system including data storage on three drives and parity information on the fourth. For that information which was only stored on the first three drives which were present in the system, the host computer will only look to those three drives for data and parity information.

In another embodiment, the system will always store data onto disk drives, and parity information and a third. Adding a fourth drive to the system causes the host computer to distribute the data differently, writing data on two of the disk drives, and parity information on a third. The host system will attempt to evenly distribute the added information to ensure that the three disk drives which were originally in the system will not become filled to capacity while the added disk drive remains essentially empty. In this embodiment, once information which was previously stored on the three disk drives in the system is modified, or added to, the files are rewritten by the host computer in order to distribute the data amongst the four disk drives presently in the system. The same principles apply when a fifth, sixth, seventh or subsequent disk drive is added to the system.

There has been described here and above a novel expandable disk drive system. Those skilled in the art may now make numerous departures from the particular embodiments disclosed here and above, including, but not limited to enclosing two, three, or more discreet disk drives within each module 30 of the system; employing 5¼ inch 3½ inch, 1.8 inch, 1 inch, or other varieties of form factor disk drives; employing numerous types of data protocols; employing optical or worn drives; employing larger or smaller power supplies within each module; employing piezo electric or semiconductor based cooling systems instead of fans; reducing the number of fans within the stack and allowing air to flow between modules of the stack; varying the type of connectors, switches, screws, nuts and bolts which are employed; varying the number of data lines which are interconnected between the adjacent modules or the host computer system; employing different switch assemblies, additional or fewer indicator lamps; employing liquid crystal displays instead of light emitting diodes; providing active buffer or circuitry to electrically isolate the stack; employing a/c powered fans; and making numerous other modifications of the implementations described above without departing from the inventive spirit herein which is defined solely by the following claims.

What is claims is:

1. A modular expandable disk drive storage system comprising:

at least two modules, each module including a housing and at least one disk drive unit having a disk drive and a power converter located within the unit, said disk drive unit being slidably mounted within said housing, each module defining a front, back, top, bottom, and left and right sides, an inside and an outside, said modules being stacked one on top of another, the modules all facing in the same direction;

a data cable connected to the front, outside portion of the bottom most of said modules, said data cable connecting said modular expandable disk drive storage system to an external computer;

a power cable connected to an external power source;

at least two power connectors located on the front, outside portion of each module, said power connectors of each module being internally electrically connected to each other;

at least one power interconnection cable connected to the front, outside portion of each module, said power interconnection cable plugged into one of the power connectors on each of two adjacent modules, and electrically connecting the power connectors to each other;

at least two data connectors located on the front, outside portion of each module, said data connectors of each module being internally electrically connected to each other;

at least one data interconnection cable connected to the front, outside portion of each of said modules, said data interconnection cable plugged into one of the data connectors on each of two adjacent modules, and electrically connecting the data connectors to each other;

air circulating means mounted on each of said modules and located on one of the back, left, and right side of each module for cooling the contents of said modules;

at least one power switch mounted on each module, accessible only from the front, outside of said modules, and electrically connected between said power cable and said power conversion means;

at least one address selection switch mounted on each module electrically connected to said at least one disk drive unit for selecting the address of the disk drive unit and accessible only from the front, outside of said module;

ventilation means in each module for allowing air contained within said module to be expelled from said module;

at least one activity indicator mounted on each module, visible from the outside of said module and electrically connected to said at least one disk drive unit for indicating when said disk drive unit is being addressed; and mounting means located on the top and bottom of each module for affixing the top of one module to the bottom of another module to prevent movement of one module relative to another module once the modules have been assembled in the modular expandable disk drive storage system.

2. A modular expandable disk drive storage system comprising:

one or more modules, each module comprising:
- a frame defining a top and a bottom;
- a disk drive unit including a disk drive and a power converter located within the unit, the disk drive unit being slidably mounted within the frame;
- circulating means, including a fan, for cooling said power converter and said disk drive;
- a first connector electrically connected to said power converter for providing power to said module;
- a second connector electrically connected to said disk drive unit to enable data transfer between said disk drive and an external computer system;
- a third connector electrically connected to said first connector and accessible only from the outside of said frame for providing power to an adjacent module; and
- a fourth connector electrically connected to said second connector and accessible only from the outside of said frame for providing data to an adjacent module;
- at least one switch electrically connected between said first connector and said power converter;
- at least one address selection switch electrically connected to said disk drive unit; and
- mechanical interlocking members associated with the top and bottom of the frame to secure adjacent modules to one another and to prevent movement of adjacent modules relative to one another.

3. The device as described in claim 2, wherein said one or more modules comprise first, second and third modules including first, second and third disk drives, respectively, and wherein data is stored on said first and second disk drives and parity information is stored on said third disk drive, said parity information relating to the data, whereby the data stored on said first and second disk drives may be re-created by analyzing data from one of said first and second disk drives and said parity information.

4. An expandable modular disk drive storage system which may be expanded on a modular basis, comprising:
- at least three disk drive units, each including disk drive, a fan and a power converter located within the disk drive unit;
- a housing for each of said disk drive units, one housing and one disk drive unit defining a modular unit, each housing being substantially identical and defining a top and a bottom, said housings being mounted on top of one another to form a single large capacity digital storage system;
- said disk drive units being slidably mounted in said housings;
- said housings each including mechanical interlocking members associated with said top and bottom of the housing to secure adjacent housings to one another and to prevent movement of adjacent housings relative to one another;
- said modular units including power connections extending successively from one of said modular units to the successive additional modular units; and
- said modular units including digital signal connections extending successively from one of said modular units to the successive additional units.

5. An expandable modular disk drive storage system which may be expanded on a modular basis, comprising:
- at least two substantially identical modular units, each modular unit including a housing defining a top and a bottom, at least one disk drive unit having a power converter and a disk drive located within the unit, the disk drive unit being slidably mounted in said housing, and a fan, said housings being stackable on top of one another and each including mechanical interlocking members associated with said top and bottom to secure adjacent modular units to one another and to prevent movement of adjacent modular units relative to one another;
- electrical power connections extending successively from each modular unit to the next successive modular unit; and
- digital signal connections extending successively from each modular unit to the next successive modular unit such that said disk drive units are electrically coupled together to form a single large capacity digital storage system.

6. A modular disk drive storage system as claimed in claim 5, wherein multiple modular units are stacked, one upon another, facing in the same direction.

7. A modular disk drive storage system as claimed in claim 5, wherein said modular units are positioned adjacent to each other.

8. A modular disk drive storage system as claimed in claim 5, wherein said at least one disk drive unit comprises at least one of a 5 and ¼ inch disk drive and a 3 and ½ inch disk drive.

9. A modular disk drive storage system as claimed in claim 5, further comprising connector panels mounted on said modular units to cover and to protect said electrical power connections and said digital signal connections.

10. A modular disk drive storage system as claimed in claim 5, further comprising a bottom panel and a top panel mounted on a bottom and a top modular unit, respectively, to cover and to protect said electrical power connections and said digital signal connections.

11. A modular disk drive storage system as claimed in claim 5, wherein said digital signal connections utilize the Small Computer System Interface (SCSI) protocol.

12. A modular disk drive storage system as claimed in claim 5, wherein said digital signal connections utilize the Enhanced Small Device Interface (ESDI) protocol.

13. A modular disk drive storage system as claimed in claim 5, further comprising non-skid feet attached to a bottom modular unit to prevent the unit from sliding.

14. A modular disk drive storage system as claimed in claim 5, wherein each disk drive unit comprises:
- a base tray having front, bottom, and back panels and a tray cover having right, left, and top panels defining a substantially closed space, said fan being mounted on said back panel and said power converter being mounted substantially within said substantially closed space;
- at least one disk drive mounted substantially within said substantially enclosed space;
- a power receiving connector mounted on said front panel and connected to said power converter;
- a power providing connector mounted on said front panel;
- a power sharing circuit mounted on said front panel and located inside said substantially closed space that forwards the incoming power from said power receiving connector to said power converter and to said power providing connector;
- at least one address selection switch mounted on said front panel and electrically connected to said at least one disk drive for selecting the address of said at least one disk drive;

a computer data receiving connector mounted on said front panel;

a computer data providing connector mounted on said front panel;

said computer data connectors being electrically connected to each other and to said at least one disk drive;

a drive activity indicator light source mounted on said front panel and electrically connected to said at least one disk drive;

a power on/off switch mounted on said front panel;

a power on indicator light source mounted on said front panel and electrically connected to said power on switch; and a front bezel affixed to said front panel with openings for said connectors, switches, and lights, with assembly points to meet with said housing, and with ventilation holes.

15. An expandable modular disk drive storage system as claimed in claim 5, further comprising:

means for supporting a lowermost module on a support structure.

16. An expandable modular disk drive storage system which may be expanded on a modular basis, comprising:

at least three substantially identical modular units defining a top and a bottom and stackable on top of one another, each modular unit including a housing, at least one disk drive unit having a power converter and a disk drive located within the unit, the disk drive unit being slidably mounted in said housing, and mechanical interlocking members associated with the top and bottom to secure adjacent modular units to one another and to prevent movement of adjacent modular units relative to one another;

a fan mounted substantially within each modular unit;

ventilation openings associated with said modular units;

electrical power connections extending successively from each modular unit to the next successive modular unit; and digital signal connections extending successively from each modular unit to the next successive modular unit such that said disk drive units are electrically coupled together to form a single large capacity digital storage system.

17. An expandable modular disk drive storage system which may be expanded on a modular basis, comprising:

one or more substantially identical modules, each module defining a top and a bottom and including a housing unit which is stackable on top of the housing unit of another module, one or more disk drive units having a disk drive and a power converter located within the unit, the disk drive units being slidably mounted in each housing unit, a fan, a front panel, ventilation openings on said front panel for allowing flowing air to cool the module and mechanical interlocking members associated with said top and bottom to secure adjacent module to one another and to prevent movement of adjacent modules relative to one another;

multiple power connectors mounted on each module allowing successive connection of the modules for delivery of electrical power; and multiple digital signal connectors mounted on each module allowing successive connection of the modules for digital data communication purposes.

18. A modular disk drive storage unit comprising:

at least three housings, each housing defining a top and a bottom and having mechanical interlocking members associated with the top and bottom to secure adjacent housings to one another and to prevent movement of adjacent housings relative to one another;

at least one disk drive unit slidably mounted in each housing, each disk drive unit including a disk drive, a base tray having a front, bottom, and back panels and a tray cover having right, left, and top panels defining a substantially closed space;

at least one fan mounted on the back panel of each disk drive unit;

a power receiving connector mounted on said front panel of each disk drive unit;

a power converter mounted substantially within each disk drive unit to receive electrical power from said power receiving connector, convert it to a form useful for said at least one disk drive and said fan, and forward it to said at least one disk drive and said fan;

a power providing connector mounted on said front panel of each disk drive unit;

an electrical power connection connecting the power providing connector of one disk drive unit to the power receiving connector of an adjacent disk drive unit;

a power sharing circuit mounted on said front panel of each disk drive unit that forwards the incoming power from said power receiving connector to said power converter and to said power providing connector;

at least one address selection switch mounted on said front panel of each disk drive unit and electrically connected to said at least one disk drive for selecting the address of said at least one disk drive;

a computer data receiving connector mounted on said front panel of each disk drive unit;

a computer data providing connector mounted on said front panel of each disk drive unit;

a digital signal connection connecting the data providing connector of one disk drive unit to the data receiving connector of an adjacent disk drive unit;

said computer data connectors being internally electrically connected to each other and to said at least one disk drive;

a drive activity indicator light source mounted on said front panel of each disk drive unit and electrically connected to said at least one disk drive;

a power on/off switch mounted on said front panel of each disk drive unit;

a power on indicator light source mounted on said front panel of each disk drive unit and electrically connected to said power on switch; and a front bezel affixed to said front panel of each disk drive unit, with openings for said connectors, switches, and lights and with ventilation holes.

19. A modular disk drive storage unit as claimed in claim 18, wherein said at least one fan causes exterior air to enter the disk drive unit through the fan, flow across the substantially closed space, and exit via the ventilation holes.

* * * * *

UNITED STATES PATENT AND TRADEMARK OFFICE
CERTIFICATE OF CORRECTION

PATENT NO. : 6,640,235 B1
DATED : October 28, 2003
INVENTOR(S) : Anderson

It is certified that error appears in the above-identified patent and that said Letters Patent is hereby corrected as shown below:

Column 6,
Line 3, delete "134", insert -- 124 --.
Line 4, delete "132", insert -- 122 --.

Signed and Sealed this

Second Day of March, 2004

JON W. DUDAS
*Acting Director of the United States Patent and Trademark Office*